United States Patent
Emery et al.

(12)

(10) Patent No.: US 6,271,961 B1
(45) Date of Patent: Aug. 7, 2001

(54) SEMICONDUCTOR OPTICAL COMPONENT AND AMPLIFIER AND WAVELENGTH CONVERTER CONSISTING THEREOF

(75) Inventors: Jean-Yves Emery, Palaiseau; Fabienne Gaborit, Limours; Christopher Janz, Issy-les-Moulineaux; François Dorgeuille; Béatrice Dagens, both of Paris, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/318,273

(22) Filed: May 25, 1999

(30) Foreign Application Priority Data

Jun. 15, 1998 (FR) .................................... 98 07493

(51) Int. Cl.[7] ................ G02F 1/35; H01S 3/00; H01S 5/00
(52) U.S. Cl. ................ 359/332; 359/326; 359/333; 359/342; 372/43; 372/46; 372/50
(58) Field of Search .................. 372/43, 45, 46, 372/50; 359/332, 326, 333, 342; 385/5, 14

(56) References Cited

U.S. PATENT DOCUMENTS

| 4,680,769 | 7/1987 | Miller ........................ 372/50 |
| 5,283,799 | 2/1994 | Jacquet et al. ................ 372/50 |
| 5,604,762 | * 2/1997 | Morinaga et al. ............ 372/43 |
| 5,754,714 | 5/1998 | Suzuki et al. ................ 385/5 |

FOREIGN PATENT DOCUMENTS 8-3347697   12/1996  (JP) .

\* cited by examiner

*Primary Examiner*—Andrey Chang
(74) *Attorney, Agent, or Firm*—Sughrue, Mion, Zinn, Macpeak & Seas, PLLC

(57) ABSTRACT

An active structure in the semiconductor die of an amplifier or converter includes a plurality of stacked active layers with different compositions. The different compositions lead to a spectral offset between the respective gain bands of the layers which widens the gain band of the amplifier or the optical bandwidth of the converter. Applications include fiber optic telecommunication networks.

21 Claims, 4 Drawing Sheets

SEMICONDUCTOR OPTICAL COMPONENT AND AMPLIFIER AND WAVELENGTH CONVERTER CONSISTING THEREOF

BACKGROUND OF THE INVENTION

1. Field of the Invention

The present invention concerns a component that can in particular constitute a semiconductor optical amplifier. An amplifier of this kind has an active structure consisting of an undoped active layer or a plurality of such layers stacked in a vertical direction. This structure simultaneously constitutes a waveguide guiding light waves in a longitudinal direction. It is placed between two injection layers, a p-doped layer and an n-doped layer. A pump current flows in the vertical direction to inject n and p type carriers into the active layer(s) from the respective injection layers. The presence of the two types of carrier is necessary for the active layers to be able to amplify light passing through them by virtue of recombination of carriers of one type with those of the other type.

2. Description of the Prior Art

Amplifiers of the above kind are typically used at the nodes of fiber optic telecommunication networks. The information transmission capacity of a network of the above kind is increased by wavelength-division multiplexing, which enables a plurality of carrier waves to be transmitted on the same optical fiber. Within a node of the network, the same amplifier is then used to confer an appropriate optical power on all the waves. The wider the spectral range that these waves occupy, or could occupy, the greater the capacity of the network. However, the amplifier can impart this power to these waves only if their wavelengths are within a gain band of the amplifier. This is why the need for a wider gain band has often been felt.

Such widening has been obtained in a first prior art amplifier in the form of a waveguide amplifier constituting an amplifying part of a tunable laser oscillator. The oscillator is described in U.S. Pat. No. 4,680,769 (Miller). Its amplifying part includes two of said active structures in succession in the longitudinal direction and each consisting of an active layer, i.e. the light passes through the two structures in succession and two pump currents are supplied for the respective structures.

The gain band of the above amplifier is widened because the layers constituting the two active structures are made of two different materials. This difference in composition leads to a difference between the respective energy gaps between the valency band and the conduction band in the two layers. These bands are those in which the energy levels that can be occupied by the electrons are situated. For the active material these energy gaps define a characteristic wavelength that constitutes an upper limit on the gain band and thereby defines the position of that band within the spectrum of wavelengths. As a result the gain bands of the two active structures are offset relative to each other. They partly overlap each other, however. The wavelength emitted by the oscillator can be tuned by virtue of the fact that, in each of the two structures, the gains of the structure for wavelengths included in the gain band of the structure are controlled by the pump current. The two pump currents are then chosen to obtain a maximum gain for a chosen wavelength in the gap between the center wavelengths of the two gain bands specific to the two active structures.

If it had to be used as a widened gain band amplifier, this first prior art amplifier would have the drawback of requiring adjustment of two pump currents.

It is now widely known that the gain band of a semiconductor waveguide amplifier is greater if the active structure of the amplifier comprises quantum wells than if it comprises a bulk active layer like that of each of the two active structures of the first prior art amplifier. A bulk layer of the above kind is a layer formed from a bulk material. The wells of a quantum well structure take the form of stacked thin layers separated from each other by barriers whose thicknesses are comparable with those of the wells. With the aim of confining the waveguide functions of the charge carriers in each of the above wells, the material of the well is chosen to have an energy gap much less than that of the barriers. The difference between the two gaps is at least 100 meV and typically around 250 or 300 meV. The thickness of each such well is typically in the order of 10 nm while that of a bulk layer is typically in the order of 100 nm. This is why, to obtain the same total thickness of active material, an active structure with quantum wells typically comprises around ten wells. The gain band of the resulting structure is widened because the small thickness of the wells increases the density of the energy levels that can be occupied by the electrons in the wells. It is nevertheless desirable to increase further the gain bandwidth of an amplifier of the above kind.

This widening is achieved in a second prior art amplifier which takes the form of a semiconductor waveguide amplifier whose active structure comprises quantum wells. The second prior art amplifier is described in a paper given to the Topical Meeting on Quantum Optoelectronics, Salt Lake City, USA, March 1991, O.S.A. 1991 Tech. Digest Ser . . . , "Broadband GaAs/Al$_x$Ga$_{1-x}$As Multi-Quantum Well LED", A. J. Moseley, D. J. Robbins, C. Meaton, R. M. Ash, R. Nicklin, P. Bromley, R. R. Bradley, A. C. Carter, C. S. Hong and L. Figueroa. The widening of the gain band results from the fact that the quantum wells of the active structure comprise active materials having different compositions from well to well. As previously explained, because of such differences in composition the successive wells have gain bands offset relative to each other. The offset between two successive wells is sufficiently small for the respective gain bands of the two wells to overlap partly, which results in a substantially continuous gain band for the active structure. This band can be very wide because it includes the respective gain bands of all the wells. The second prior art amplifier has the following drawbacks:

It is complex to make.

Obtaining the required gain in each of the gain bands of the various active layers requires the pump current to create a sufficient positive and negative charge carrier density in each layer. This requirement is easily met for negative charge carriers (electrons) because their high mobility means that they can quickly reach the quantum wells at the greatest distance from the n type injection layer from which they were injected into the active structure. Unfortunately, the same cannot be said for the positive charge carriers (holes), which are well known to be much less mobile. Large number of holes could disappear through recombination in the wells nearest the p type injection layer from which they originate and consequently not be injected in sufficient numbers into the wells at the greatest distances from that layer. This could lead to insufficient gain or excessively high instability of the gain in the gain bands of the active layers nearest the n type injection layer. To prevent this lack of uniformity of injection of holes making the gain of certain wells too low or excessively unstable, all the quantum wells and all the barriers of the second prior art laser are heavily p-doped, which artificially increases the density of holes at all points. This heavy doping has the drawback of further complicating the production of the amplifier and above all of increasing the absorption of light in the active structure. Any such loss of light must be compensated by increasing the intensity of the pump current, which leads to a corresponding increase in the thermal power to be evacuated.

One particular aim of the present invention is to enable simple production of a semiconductor optical amplifier with a widened gain band and the invention consists in particular in an amplifier of this kind.

SUMMARY OF THE INVENTION

Like the second prior art amplifier described above, the amplifier of the invention includes a waveguide forming part of a semiconductor die consisting of layers extending in horizontal directions of said die and forming a succession with crystalline continuity in a vertical direction of the die. The waveguide extends in one of the horizontal directions. It includes active materials having respective compositions and respective energy gaps enabling them to amplify optical waves propagating in the guide. The active materials have a variation in composition in the vertical direction leading to a variation in energy gap.

In the amplifier of the invention, at least some of the active materials are included in the waveguide in the form of bulk materials.

In the ordinary way, by "bulk materials" is meant materials that do not form quantum wells, in other words, and more precisely, materials that form at least one layer in whose thickness, which is at least 20 nm and measured in the vertical direction, the variation in the energy gap is at most equal to 100 meV.

The invention concerns not only optical amplifiers but also wavelength converters. Like optical amplifiers, wavelength converters are typically used at the nodes of fiber optic telecommunication networks. For example, when a wavelength referred to hereinafter as the primary wavelength has been allocated to a signal to constitute the wavelength of an optical wave carrying that signal in a line joining first and second nodes of a network, the second node beneficially includes a converter of the above kind. It enables the same signal to be allocated another wavelength to constitute the wavelength of another optical wave carrying the signal in another line connecting the second node to a third node of the network. This wavelength reallocation is necessary if the other line is already guiding another signal with the primary wavelength. Converters of the above kind can also route such signals at each node of the network.

Producing such converters in the form of semiconductor dies with internal structures analogous to those of the above amplifiers is known per se. However, the technical constraints relating to the production of such converters are very different to those relating to amplifiers. In particular, semiconductor amplifiers typically function in a linear region corresponding to an input power in the range from −40 dBm to −15 dBm but a converter of the above kind operates under saturated conditions corresponding to a primary carrier wavelength power greater than −15 dBm. What is more, the efficiency of the converter is typically higher if the length of the waveguide containing its active material is greater than 1 mm and more particularly greater than 1.2 mm, whereas the optimum length of the corresponding guide of an amplifier is less than 1 mm and can with benefit be made even smaller to maintain linear operation in the presence of high input powers.

For the same reasons as indicated above in the case of amplifiers, the need has been felt to widen the optical bandwidth of a converter of the above kind. This band is the band in which the primary wavelength must be situated for the signal carried by that wavelength to be transferred in the converter so that at the output of the converter the signal is carried by a secondary carrier wave whose wavelength must typically be in the same band. It must be distinguished from the modulation band, which is the band of frequencies in which a signal must be situated to be transferred in the above manner.

A prior art optical wavelength converter of the above kind is discussed in a doctoral thesis submitted to the Denmark Technical University: C. J. Videcrantz, Ph. D. Thesis, Optical Amplification and Processing in High-Capacity Photonic Networks, March 1997, LD 124.

It has the particular drawback that its optical bandwidth is narrowed in the vicinity of 30 nm if its confinement factor has a suitable value such as 0.85.

One particular aim of the present invention is to simplify production of a wavelength converter having an enlarged optical bandwidth whilst efficiently transferring a signal from one optical carrier wave to another such wave.

With this aim in view, the invention also consists in an optical wavelength converter. Like the prior art converter mentioned above, the converter of the invention includes means for enabling the waveguide to guide simultaneously two optical waves respectively constituting a primary carrier wave and an auxiliary wave, the carrier wave having a primary wavelength and being amplitude modulated to convey a signal to be transmitted and constituting primary modulation, the waveguide including an active structure sensitive to the primary modulation for converting the auxiliary wave into a secondary carrier wave having the same wavelength as the auxiliary wave and secondary modulation carrying the signal to be transmitted, in which optical wavelength converter the active structure includes a plurality of active materials each sensitive to the primary modulation only if the wavelength is within a spectral band constituting a gain band of the active material, the gain bands of the active materials being offset relative to each other.

Because, in a converter of the above kind, the modulation of the primary carrier wave operates on the auxiliary wave by modulating a charge carrier density in the active structure, and because the carrier density modulation is accompanied at least locally by amplification of the carrier wave, one condition for the converter to be efficient is that the wavelength of the carrier wave must be in the gain band of the structure. The offset in accordance with the present invention between the respective gain bands of the various active materials included in the structure widens the gain band. It therefore widens the optical bandwidth of the converter. If the secondary modulation required at the output of the semiconductor die is amplitude modulation rather than phase modulation, the present invention enlarges the band of wavelengths within which the auxiliary wave must be located. In fiber optic telecommunication networks using wavelength-division multiplexing and successive allocation of wavelengths during routing, the two bands are typically identical, with the result that widening of one of them is equivalent to widening of the other regardless of the type of secondary modulation required at the output of the semiconductor die.

The plurality of active materials is preferably included in the active structure in the form of bulk materials. Implementing the plurality of active materials in the form of bulk materials facilitates production of the converter and has the considerable advantage of making the converter highly efficient. Its efficiency is preferably increased by the fact that the active materials constitute at least in part a core of the waveguide through occupying at least 80% of the volume of the core. As in the amplifier of the present invention, this concentration of active material in the core of the waveguide imparts a high value to the confinement coefficient of waves in the material. In the case of the converter, this concentration imparts to the confinement coefficient of optical waves in the optically active areas a value as high as, and possibly higher than, in the aforementioned prior art converter and this encourages the intermodulation that must occur between the primary carrier wave and the auxiliary wave.

The plurality of active materials is preferably included in the active structure in the form of a plurality of homogeneous layers respectively consisting of the above materials. The layers constitute respective active layers which are stacked and preferably in contact with each other. This is simple to achieve and imparts a maximum value to the concentration of the active material in the core of the waveguide.

Various embodiments of the present invention will now be described with reference to the accompanying diagrammatic drawings.

DETAILED DESCRIPTION OF THE PREFERRED EMBODIMENTS

Figure 1:
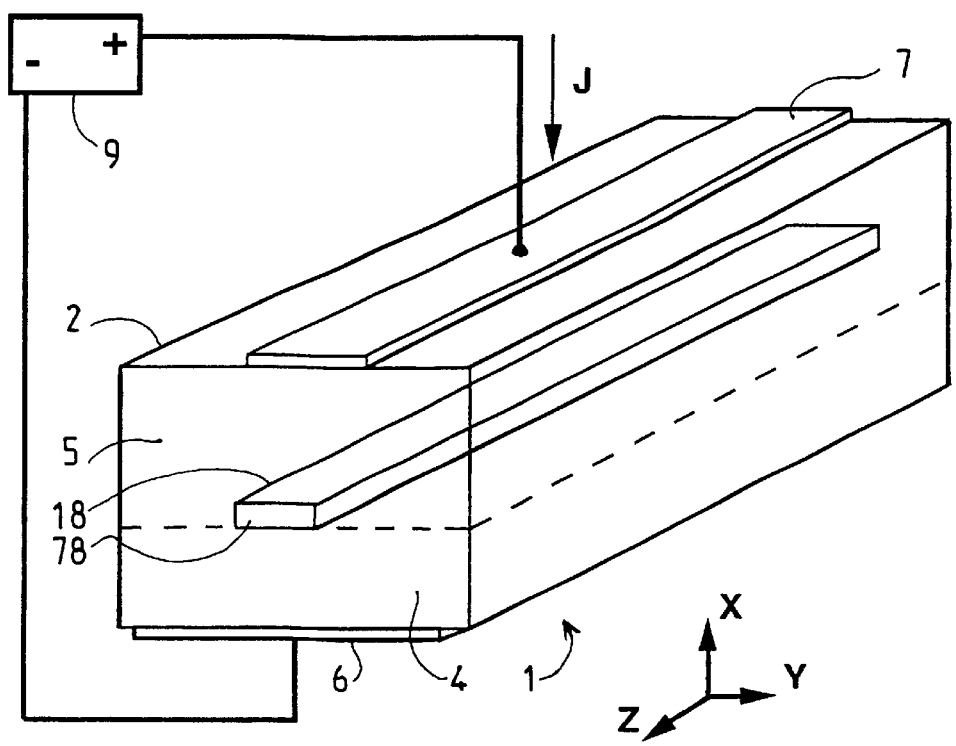
FIG. 1 is a perspective view common to first, second and third amplifiers and first, second and third converters in accordance with the invention.

In the figures, arrows indicate two of the aforementioned horizontal directions, namely a longitudinal direction Z and a transverse direction Y. The vertical direction DV comprises a vertically upward direction X and a vertically downward direction J which are mutually opposite. All the above directions are related to one of the semiconductor dies.

Preferred features of all amplifiers in accordance with the invention will be described first in connection with the first amplifier in accordance with the invention and with reference to FIGS. 1 and 2a. In those figures, the succession of layers of the semiconductor die 2 of an amplifier of the above kind includes, as in the prior art amplifiers, the following layers and sets of layers in succession in the vertically upward direction X:

An n-doped indium phosphide substrate. A substrate of the above kind is widely available off the shelf.

The bottom injection layer. This layer consists of indium phosphide. It is n-doped with a doping concentration of $3.10^{18}$ cm$^{-3}$. The substrate and the layer are collectively designated by the reference numeral 4 in the figure.

A waveguide 18 extending along and guiding optical waves along the longitudinal direction Z and having a limited width in the transverse direction Y. In FIG. 1, the die 2 is shown as if it were transparent so that the guide can be seen. The various layers constituting the guide are quaternary materials, to be more precise indium and gallium phosphide and arsenide. They are not intentionally doped. They are described in more detail below. Like the bottom injection layer, they are formed successively on the substrate by epitaxial deposition. Subsequent etching then delimits the guide in the transverse direction before the next layer is deposited. The waveguide includes an active structure 10 for amplifying optical waves having wavelengths within a gain band of the structure. The structure is able to amplify these waves if they propagate in the structure in the presence of charge carriers of each of the two types (positive and negative). It has an average refractive index greater than the refractive indices of the layers surrounding the structure to constitute at least a part of a core of the waveguide.

Finally, the top injection layer 5. This p-doped layer is of indium phosphide and has a doping coefficient of $10^{18}$ cm$^{-3}$.

The amplifier further includes:

a bottom electrode 6 formed on the die, a top electrode 7 formed on the die and cooperating with the bottom electrode to inject a pump current into the die in the vertical direction, and a current source 9 to supply the pump current and inject it into the die in a forward direction J which is the vertically upward or downward direction.

The forward direction is defined by the doping of the bottom and top injection layers. It is such that this current injects charge carriers of both types into the active structure from the injection layers.

As in the second prior art amplifier, the active structure includes a plurality of active materials so that the composition of the structure varies in the vertical direction. This variation in the composition is accompanied by corresponding variations in:

the local energy gap between the valency band the conduction band, the local characteristic wavelength, and the spectral position of the local gain band.

The active materials are preferably incorporated in the active structure 10 in the form of a plurality of homogeneous layers forming a succession in the vertical direction and constituting active layers, namely two such layers 11 and 12 in the case of the first amplifier in accordance with the invention. The structure and the layers have respective thicknesses. The layers also have compositions defining respective energy gaps for these layers, respective characteristic wavelengths, and respective gain bands, the gain bands of the layers partially overlapping each other. Forming the active structure as a limited number of stacked homogeneous layers has the advantage of being easier than forming a single, thicker layer with the composition varying progressively in the vertical direction.

Each of the active layers offers light amplification gains when charge carriers of each of said two types are present in that active layer with respective sufficient densities to provide such gains. These gains are dependent on the wavelengths of the waves. They are zero for wavelengths outside the gain band of the layer. As a result the gain band of the active structure is a composite gain band made up of the gain bands of the active layers. The gains are also dependent on the thicknesses and the positions of the layers. The respective thicknesses, positions and compositions of the active layers must therefore be chosen so that the same pump current can produce, in each layer and for each of the two types of charge carrier, a sufficient density to provide such gain for wavelengths within the gain band of that layer.

Certain limitations appear to be desirable for this: the thicknesses of the active layers 11, 12 are preferably in the range from 20 nm to 400 nm, the number of active layers is preferably at most equal to 4, and the respective energy gaps of any two active layers preferably have a mutual difference at most equal to 60 meV.

In the context of the present invention, and given the semiconductor materials available off the shelf, it is apparent that complying with the above limitations would economically produce a sufficiently uniform distribution of the injection of charge carriers between the various active layers for the gain of the structure to be more or less uniform throughout the composite gain band. This uniform injection has to be achieved not only in respect of the negative charge carriers, i.e. the electrons, which is easy because of their high mobility, but also in respect of the positive charge carriers, i.e. the holes, which are less mobile. In particular, it has not appeared necessary for this to use p-doped active layers.

With reference to the limitation concerning the maximum difference between the respective energy gaps of any two active layers, and allowing for the fact that these energy gaps define the characteristic wavelengths of the layers, it is clear that a limitation of the above kind leads to a limit on the corresponding difference between the characteristic wavelength and therefore a limitation on the composite gain bandwidth. However, it should be noted that, for a given value of the maximum difference between two energy gaps, the maximum difference between the corresponding characteristic wavelengths increases as the average wavelength of the composite gain band increases. As a result this type of limitation is not much of a problem in practice if the required gain band is around 1 500 nm, which is the case in many fiber optic telecommunication networks.

At least 80% of the core 10 of the waveguide is preferably made up of active layers. Given that the core consists of the active structure, this amounts to saying that these layers are closer together in the structure than quantum wells separated by barriers would be. More particularly, the active layers 11, 12 are stacked with successive layers in contact. Such proximity, preferably going as far as actual contact, between active layers having increased refractive indices, i.e. refractive indices greater than those of the surrounding layers, enables a high value to be imparted to the confinement coefficient, which represents the proportion in which optical waves are confined within the active material. In this way it encourages amplification.

The waveguide preferably includes in succession in the vertically upward direction X:

a bottom confinement layer 13 having a refractive index and a characteristic wavelength that are respectively less than each refractive index and less than each characteristic wavelength of the active layers, the active structure 10, and a top confinement layer 14 having a refractive index and a characteristic wavelength that are respectively less than each refractive index and each characteristic wavelength of the active layers.

The characteristic wavelengths of the confinement layers are then outside the composite gain band and each confinement layer is in contact with one of the active layers.

Figure 2A:
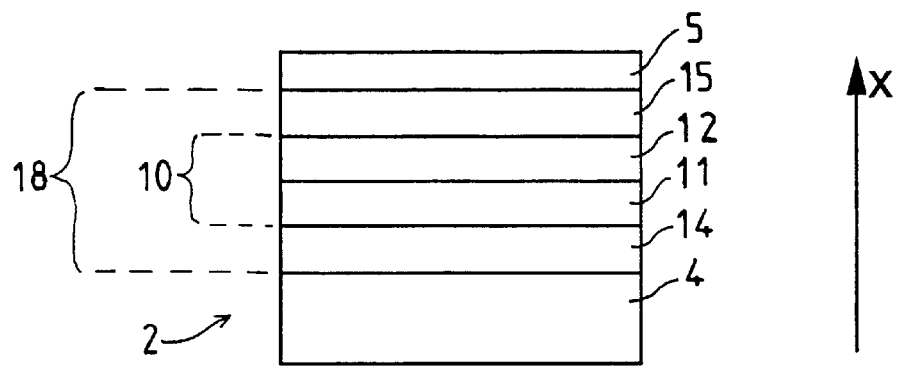
FIGS. 2a, 3a and 4a are respectively views in cross section of the semiconductor dies of the first, second and third amplifier or converter of the invention.
Figure 2B:
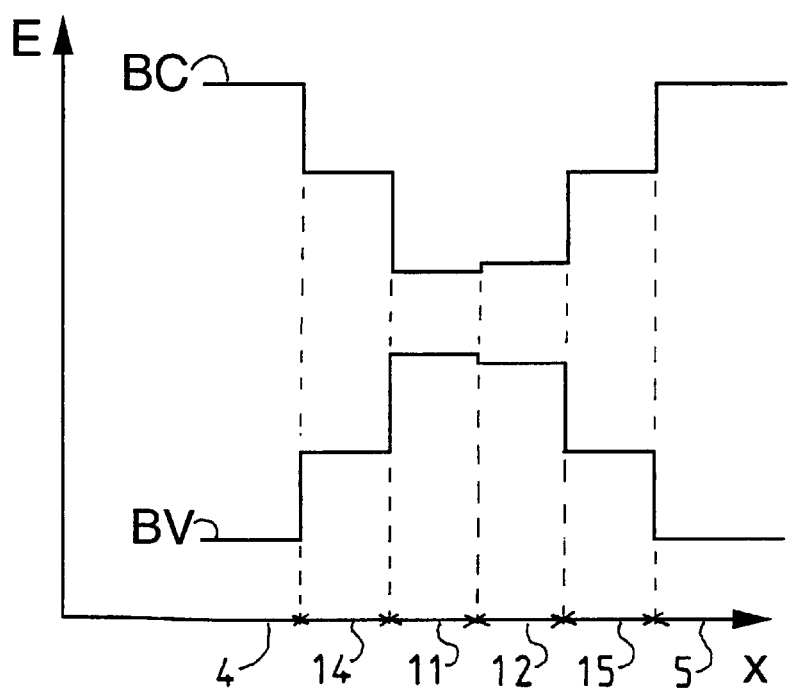
FIGS. 2b, 3b and 4b are respectively diagrams relating to the energy levels that can be occupied by electrons at various levels above substrates of the dies of the amplifiers or converters in which the energies of the levels are plotted on the ordinate axis and the levels are plotted on the abscissa axis.
Figure 3A:
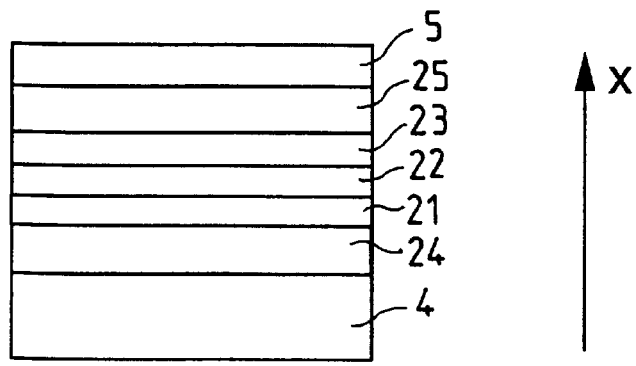
Figure 3B:
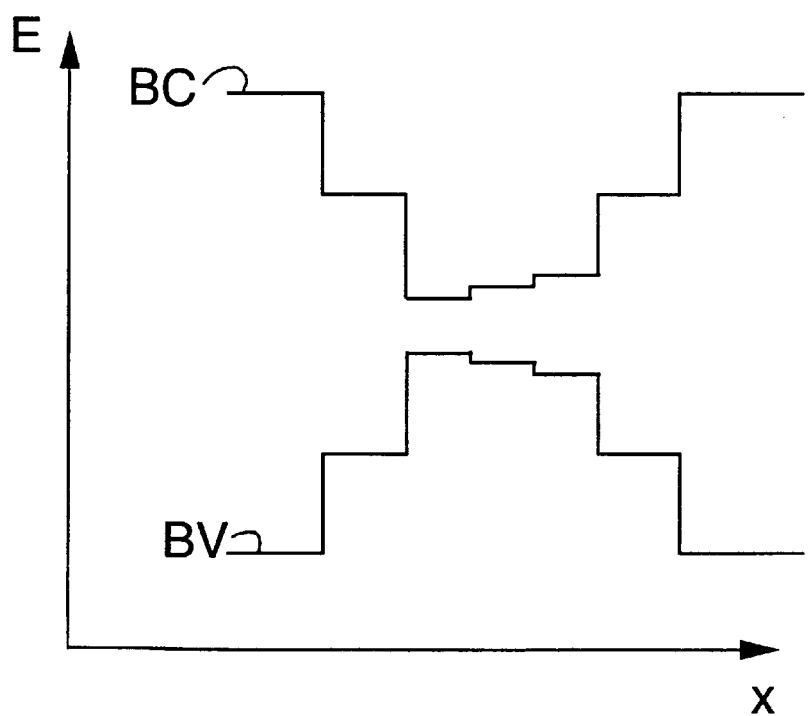
Figure 4A:
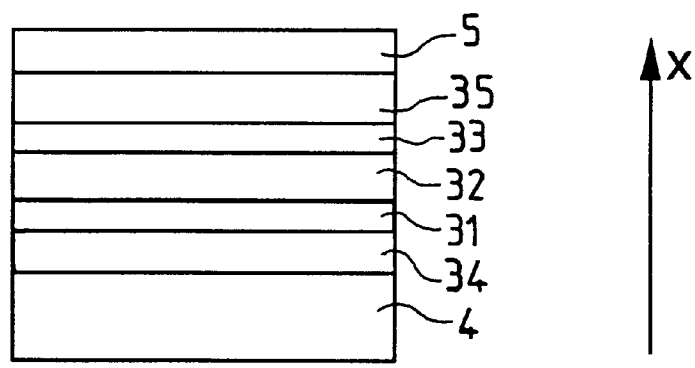
Figure 4B:
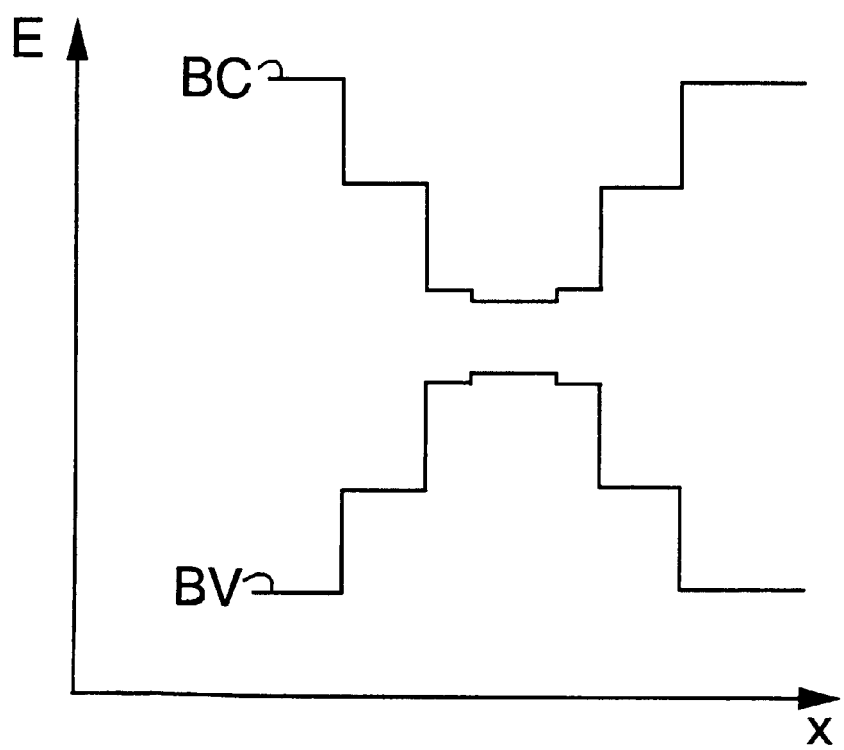

The distribution of the characteristic wavelengths of the various layers is illustrated indirectly in FIGS. 2b, 3b, 4b. In these figures the energy gaps of the various materials are represented by the vertical distances between the lower limit BC of the conduction band and the upper limit BV of the valency band. The characteristic wavelengths are inversely proportional to these gaps.

All the layers of the waveguides have compositions conforming to the formula $Ga_xIn_{1-x}As_yP_{1-y}$.

Each confinement layer is 100 nm thick, for example. Its composition is defined by the values x=0.2 and y=0.44, which give it a refractive index around 3.2 and a characteristic wavelength approximately equal to 1 180 nm.

The insertion of confinement layers between injection layers and an active structure is known per se for producing semiconductor optical amplifiers. It contributes to confining the charge carriers in a volume that contains the active structure. This volume is that of the optical guide 18 whose core consists of the active structure and whose cladding consists of the confinement layers. This effect is particularly desirable in the context of the present invention, to prevent the density of low-mobility charge carriers falling too low in an active layer.

Another arrangement is preferred for the same reason. In order to describe it, the active structure 10 is deemed to include in succession in the vertical forward direction J:

a first active layer 12, and a second active layer 11.

In this arrangement the characteristic wavelength of the first active layer is shorter than that of the second active layer. The aim is to increase the probability of holes injected from the p-doped injection layer reaching the second active layer. It is beneficial to achieve this because the probability must be sufficient to enable the pump current to maintain the sufficient density of holes in the second active layer. It is achieved because the relatively wide energy gap of the first active layer imposes a relatively low value on the probability of the holes recombining with electrons while they are passing through the first layer.

The respective thicknesses of the active layers 11, 12 are preferably in the range from approximately 50 nm to approximately 200 nm, the number of active layers is preferably at most equal to three, the difference between the respective energy gaps of any two active layers is preferably at most equal to 40 meV, and the pump current preferably has an intensity per unit surface area in the range from approximately 10 kA/cm² to approximately 50 kA/cm².

Of the layers constituting the waveguide 18, at least the active layers are preferably sufficiently strained to make the gain of the amplifier insensitive to polarization of the optical waves traveling through the guide.

A strain of this kind is used in prior art amplifiers to make the gain of an active layer insensitive to any polarization of optical waves propagating in the layer. This insensitivity is required in fiber optic communication networks because waves received from one node of a network at the output from a long line are generally polarized and because the intensity and the direction of such polarization is random. The required strain is obtained by choosing an appropriate composition of the layer to be constrained because this choice makes it possible to impose on the crystal lattice of the material of this layer a natural dimension different from that of the materials of the other layers of the semiconductor die, this natural dimension being that in the absence of any strain. Crystalline continuity between the various layers of the die then imposes on the lattice of the material of the layer to be strained a modified dimension that is substantially equal to the natural dimension of the lattice of the other layers, and this modification of the dimensions is accompanied by the generation of the necessary strain. Choosing the lattice dimension of a quaternary material having a chemical formula such as $Ga_xIn_{1-x}As_yP_{1-y}$ is compatible with choosing the energy gap of the material despite the fact that both choices are effected by selecting the composition of the material. The compatibility is due to the presence in the formula of two parameters x and y that can be chosen independently of each other.

The waveguide 18 of an amplifier in accordance with the invention typically has a length in the range from 0.3 mm to 1 mm. The length is measured in the longitudinal direction and is typically equal to that of the die 2. The width of the guide is then typically in the range from 1 000 nm to 1 500 nm.

In the first amplifier of the invention, the active structure 10 comprises two layers with the same thickness of 100 nm, namely a bottom active layer 11 and a top active layer 12.

The composition of the material of the layer 11 is defined by the values x=0.44 and y=0.89. It imparts to this material a refractive index close to 3.5 and a characteristic wavelength equal to 1 530 nm. As for the other active layers described below, the refractive index indicated for the layer 11 is that seen by the light of the component when the pump current is flowing through the die.

The chemical formula for layer 12 is defined by the values x=0.45 and y=0.92. It imparts to the material a refractive index of around 3.5 and a characteristic wavelength equal to 1 560 nm.

The second and third amplifiers in accordance with the present invention differ from the first one only in terms of the composition of their respective active structures, the confinement layers 24 and 25 of the second amplifier and 34 and 35 of the third amplifier being respectively identical to the layers 14 and 15 previously described.

The second amplifier has three active layers with the same thickness of 67 nm. The material of a bottom active layer 21 has a composition defined by the values x=0.46 and y=0.95. It has a refractive index close to 3.5 and a characteristic wavelength of 1 590 nm. The material of an intermediate active layer 22 has the same composition as the layer 12, a refractive index close to 3.5 and a characteristic wavelength of 1 560 nm. Finally, the material of a top active layer 23 has the same composition as the layer 11, a refractive index close to 3.5 and a characteristic wavelength of 1 530 nm.

The third amplifier of the invention also has three active layers.

A bottom active layer 31 is 50 nm thick. Its composition is the same as that of the layer 11 and imparts to it a refractive index around 3.5 and a characteristic wavelength of 1 530 nm.

An intermediate active layer 32 is 100 nm thick. Its composition is the same as that of the layer 12 and imparts to it a refractive index around 3.5 and a characteristic wavelength of 1 560 nm.

Finally, a top active layer 33 is identical to the layer 31.

The first, second and third converters in accordance with the present invention respectively correspond to the first, second and third amplifiers described hereinabove. Each converter includes a semiconductor die with the electrodes and the current source to supply the pump current to the die, which differs from the die of the corresponding amplifier only in terms of the length and width of the waveguide.

Figure 5:
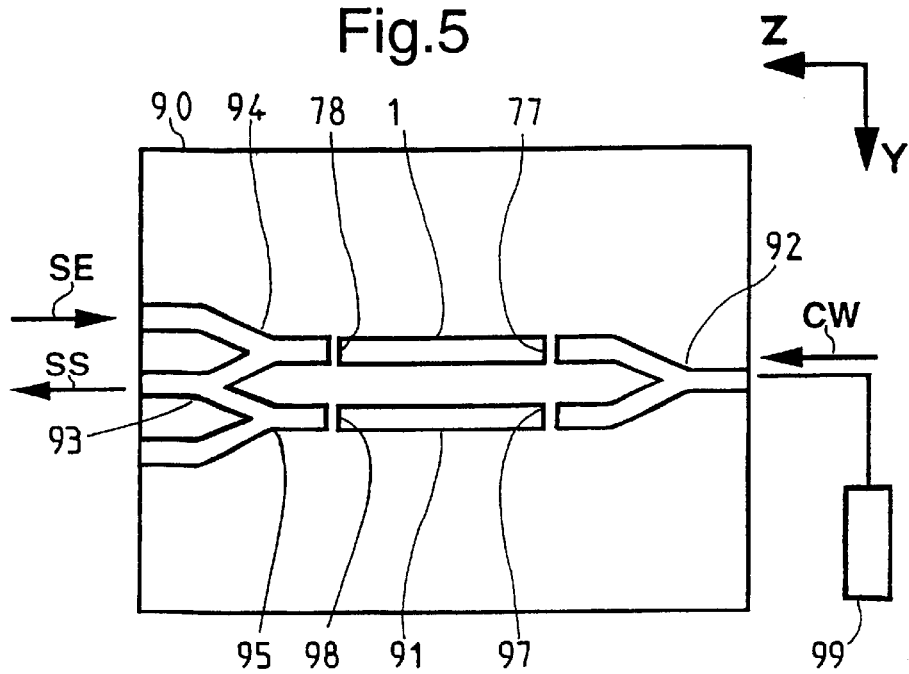
FIG. 5 is a top view common to fourth, fifth and sixth converters of the invention.

Referring to FIGS. 1 and 5, the waveguide 18 of the converter extends in a longitudinal direction Z between:

a rear port 77 for receiving the auxiliary wave CW in the form of an unmodulated continuous wave, and a front port 78 for receiving the primary carrier wave SE and supplying the secondary carrier wave. This "contradirectional" arrangement is known per se and is so called because the primary carrier wave and the auxiliary wave travel in opposite directions. In particular it enables these two waves to have the same wavelength when this is beneficial.

The waveguide of a converter of the above kind typically has a length in the range from 1 mm to 4 mm and preferably in the range from 1.5 mm to 2.5 mm, this length being measured in the longitudinal direction and typically being that of the die of the converter. The width of the guide is typically in the range from 1 000 nm to 1 500 nm.

A converter of the above kind brings about intermodulation between the primary carrier wave and the reference wave. To clarify the remainder of the description, it is therefore referred to as the "intermodulation device".

The fourth, fifth and sixth converters in accordance with the invention include such intermodulation devices. They are respectively identical to the first, second and third converters described hereinabove.

As shown in FIG. 5, and in the case of each of the fourth, fifth and sixth converters, the converter concerned has a base 90 and, on that base:

the intermodulation device 1, a reference amplifier 91 substantially identical to the intermodulation device and made up of components having the same functions and the same names as corresponding components of the device, and optical waveguides constituting:

a Y coupler constituting a rear coupler 92 for receiving a wave having the required wavelength for the auxiliary wave CW and for transmitting two equal parts of that wave respectively to the rear port 77 of the intermodulation device to constitute the auxiliary wave and to the corresponding rear port 97 of the reference amplifier to constitute a reference wave and so that this reference wave is converted by the reference amplifier into an amplified reference wave, and a composite front coupler including:

a Y coupler constituting an output coupler 93 for receiving the secondary carrier wave from said front port 78 of the intermodulation device and the amplified reference wave from the corresponding front port 98 of the reference amplifier and to supply at the output of said converter an output wave SS formed by combination of and interference between the secondary carrier wave and the amplified reference carrier wave, and a Y coupler constituting an input coupler 94 to receive the primary carrier wave at the input of the converter and to transmit it to the front port 78 of the intermodulation device.

The resulting converter takes the form of a Mach-Zehnder interferometer. Its operation is the result of the fact that the secondary modulation includes phase modulation induced by the modulation of the charge carrier density caused by variations in the intensity of the primary carrier wave. Through an interference effect, this leads to amplitude modulation of the output wave. This operation therefore necessitates balancing the respective intensities of the secondary carrier wave and the amplified reference wave. This balancing is obtained by means known per se such as regulating the intensity of the amplified reference wave by acting on the pump current of the reference amplifier. To this end a fraction of the latter wave can be sampled by means of an auxiliary coupler 95.

Each of the converters described hereinabove further includes an optical source 99 to supply the auxiliary wave CW.

What is claimed is:

1. A semiconductor optical component including a semiconductor die having a waveguide part comprising a plurality of layers extending in horizontal directions of said die and forming a succession of layers with crystalline continuity in a vertical direction of said die, at least some of said layers including a plurality of active materials having respective compositions and respective energy gaps enabling them to amplify optical waves propagating in said guide, said materials having a variation in composition in said vertical direction leading to a variation in energy gap, and at least some of said active materials being in the form of bulk materials.

2. An optical component as claimed in claim 1, constituting an optical amplifier, wherein said vertical direction comprises a vertically upward direction and a vertically downward direction that are mutually opposite and said succession of layers includes, in said vertically upward direction:

a bottom injection layer having doping of a first conductivity type, an active structure including said active materials for amplifying said optical waves having wavelengths within a gain band of said structure which is able to amplify said waves when they propagate in said structure in the presence of charge carriers of both positive and negative types, said structure having an average refractive index higher than the refractive indices of layers surrounding said structure to constitute at least part of a core of said waveguide, and a top injection layer having doping of the second conductivity type, and wherein said amplifier further includes:

a bottom electrode formed on said die, a top electrode formed on said die and cooperating with said bottom electrode to enable a pump current to be injected into said die in said vertical direction, and a current source for supplying said pump current and for injecting it into said die in a forward vertical direction, and wherein said forward direction is defined by said types of doping of said injection layers and is such that said current injects charge carriers of said two types into said active structure from said injection layers, said active materials being included in said active structure in the form of a plurality of homogeneous layers forming a succession of layers in said vertical direction and respectively constituting active layers, said structure and said active layers having respective thicknesses, said active layers also have compositions respectively defining energy gaps, gain bands of said layers and characteristic wavelengths corresponding to an upper limit on each gain band, and said gain bands of said layers partially overlapping each other, each of said active layers offering optical wave amplification gains when at the same time the wavelengths of said waves are within the gain band of said layer and charge carriers of both of said two types are present in said active layer with respective densities sufficient to allow such gains, whereby said gain band of the active structure is a composite gain band made up of said gain bands of said active layers.

3. The optical amplifier claimed in claim 2 wherein said thicknesses of said active layers are in the range from 20 nm to 400 nm, the number of active layers is at most equal to four and said respective energy gaps of any two of said active layers have a mutual difference at most equal to 60 meV.

4. The optical amplifier claimed in claim 3 wherein at least 80% of the volume of said core of said waveguide consists of said active layers.

5. The optical amplifier claimed in claim 4 wherein said active layers are stacked with successive layers in contact.

6. The optical amplifier claimed in claim 5 wherein said succession of layers includes in said upward vertical direction:

said bottom injection layer, a top confinement layer having a refractive index and a characteristic wavelength respectively less than each of said refractive indices and each of said characteristic wavelengths of said active layers, said active structure, a top confinement layer having a refractive index and a characteristic wavelength respectively less than each of said refractive indices and each of said characteristic wavelengths of said active layers, and said top injection layer, wherein said characteristic wavelengths of said confinement layers are outside said composite gain band and each of said confinement layers is in contact with one of said active layers.

7. The optical amplifier claimed in claim 6 wherein said active structure includes in succession in said forward vertical direction:

a first of said active layers, and a second of said active layers, wherein said characteristic wavelength of said first active layer is shorter than that of said second active layer.

8. The optical amplifier claimed in claim 6 wherein said bottom and top injection layers comprise a binary type III-V semiconductor, said active layers and said confinement layers are of indium and gallium arsenide and phosphide type quaternary substances with respective proportions of arsenic relative to phosphorus and of indium relative to gallium, and said active and confinement layers have no intentional doping.

9. The optical amplifier claimed in claim 3 wherein said respective thicknesses of said active layers are in the range from approximately 50 nm to approximately 200 nm, said number of active layers is at most equal to three, said difference between said respective energy gaps of any two of said active layers is at most equal to 40 meV and said pump current has an intensity per unit surface area in the range from approximately 10 kA/cm$^2$ to approximately 50 kA/cm$^2$.

10. The optical amplifier claimed in claim 2 wherein at least said active layers of said layers constituting said waveguide are subjected to sufficient strain to render the gain of said amplifier insensitive to the polarization of said optical waves traveling in said guide.

11. An optical component as claimed in claim 2 constituting an optical wavelength converter wherein:

said waveguide simultaneously guides two optical waves respectively constituting a primary carrier wave and an auxiliary wave, wherein said carrier wave has a primary wavelength and is amplitude modulated to convey a signal to be transmitted and constituting primary modulation, said waveguide includes said active structure sensitive to said primary modulation for converting said auxiliary wave into a secondary carrier wave having the same wavelength as said auxiliary wave and secondary modulation carrying said signal to be transmitted, said active structure includes said plurality of active materials each sensitive to said primary modulation only if said wavelength is within a spectral band constituting a gain band of said active material, and said gain bands of said active materials are offset relative to each other:

said waveguide of said converter extends in a longitudinal direction between a rear port for receiving said auxiliary wave in the form of a continuous wave with no modulation, and a front port for receiving said primary carrier wave and supplying said secondary carrier wave, and said semiconductor die, said waveguide and said active structure of said amplifier simultaneously and respectively constitute said semiconductor die, said waveguide and said active structure of said converter and said converter constitutes an intermodulation device.

12. The optical wavelength converter claimed in claim 11 wherein said waveguide has a length in said longitudinal direction in the range from 1 mm to 4 mm.

13. The converter claimed in claim 12 wherein said length of said waveguide is in the range from 1.5 mm to 2.5 mm.

14. The optical wavelength converter claimed in claim 11 including a base and, on said base:

said intermodulation device, a reference amplifier substantially identical to said intermodulation device, and optical waveguides constituting:

a Y coupler constituting a rear coupler for receiving a wave having the wavelength required for said auxiliary wave and for transmitting two equal parts of said wave respectively to said rear port of said intermodulation device to constitute said auxiliary wave and to a corresponding rear port of said reference amplifier to constitute a reference wave and so that said reference wave is converted by said reference amplifier into an amplified reference wave, and a composite front coupler including:

a Y coupler constituting an output coupler for receiving said secondary carrier wave from said front port of said intermodulation device and said amplified reference wave from a corresponding front port of said reference amplifier and to supply at the output of said converter an output wave formed by combination of and interference between said secondary carrier wave and said amplified reference wave, and a Y coupler constituting an input coupler for receiving said primary carrier wave at the input of said converter and for transmitting it to said front port of said intermodulation device.

15. The optical amplifier claimed in claim 1 wherein said waveguide has a length in the range from 0.3 mm to 1 mm.

16. An optical component as claimed in claim 1 constituting an optical wavelength converter wherein said waveguide simultaneously guides two optical waves respectively constituting a primary carrier wave and an auxiliary wave, wherein said carrier wave has a primary wavelength and is amplitude modulated to convey a signal to be transmitted and constituting primary modulation, said waveguide includes an active structure sensitive to said primary modulation for converting said auxiliary wave into a secondary carrier wave having the same wavelength as said auxiliary wave and secondary modulation carrying said signal to be transmitted, said active structure includes said plurality of active materials each sensitive to said primary modulation only if said wavelength is within a spectral band constituting a gain band of said active material, and said gain bands of said active materials are offset relative to each other.

17. The optical wavelength converter claimed in claim 16 wherein said active materials included in said active structure comprise said bulk materials.

18. The optical wavelength converter claimed in claim 17 wherein said active materials constitute at least part of a core of said waveguide and occupy at least 80% of said core.

19. The optical wavelength converter claimed in claim 17 wherein said active materials included in said active structure are in the form of a plurality of homogeneous layers consisting of respective active materials and constituting respective stacked active layers.

20. The optical wavelength converter claimed in claim 19 wherein said active layers are stacked with contact between them.

21. The optical wavelength converter claimed in claim 16 further comprising an optical source for supplying said auxiliary wave.

* * * * *